United States Patent
Kim et al.

(10) Patent No.: US 9,520,450 B2
(45) Date of Patent: Dec. 13, 2016

(54) FLEXIBLE DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Youngji Kim, Yongin (KR); Sohra Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 27 days.

(21) Appl. No.: 14/709,723

(22) Filed: May 12, 2015

(65) Prior Publication Data
US 2016/0079539 A1    Mar. 17, 2016

(30) Foreign Application Priority Data
Sep. 16, 2014  (KR) .......................... 10-2014-0122925

(51) Int. Cl.
*H01L 27/32*   (2006.01)
*H01L 51/00*   (2006.01)

(52) U.S. Cl.
CPC ....... *H01L 27/3211* (2013.01); *H01L 27/3244* (2013.01); *H01L 51/0031* (2013.01); *H01L 51/0097* (2013.01); *H01L 2251/568* (2013.01)

(58) Field of Classification Search
CPC .............. H01L 27/3211; H01L 27/3244; H01L 51/0097; H01L 51/0031; H01L 2251/568
See application file for complete search history.

(56) References Cited

U.S. PATENT DOCUMENTS

| | | | |
|---|---|---|---|
| 2006/0057478 A1 | 3/2006 | Kwon et al. | |
| 2007/0091062 A1 | 4/2007 | French et al. | |
| 2009/0323170 A1* | 12/2009 | Lin | B81C 1/00333 359/291 |
| 2011/0115058 A1 | 5/2011 | Mieczkowski et al. | |

FOREIGN PATENT DOCUMENTS

| | | |
|---|---|---|
| JP | 2003-131022 A | 5/2003 |
| KR | 10-2006-0025101 A | 3/2006 |
| KR | 10-2006-0134934 A | 12/2006 |
| KR | 10-2013-0109393 | 10/2013 |

OTHER PUBLICATIONS

Chobin Makabe et al., "Crack-growth arrest by redirecting crack growth by drilling stop holes and inserting pins into them", Engineering Failure Analysis 16, 2009, pp. 475-483.

* cited by examiner

*Primary Examiner* — Kyoung Lee
(74) *Attorney, Agent, or Firm* — Lee & Morse, P.C.

(57) ABSTRACT

A method of manufacturing a flexible display apparatus and a flexible display apparatus, the method including preparing a flexible substrate such that the flexible substrate includes a display area and a peripheral area at an outer portion of the display area; forming an inorganic layer portion on the display area and the peripheral area of the flexible substrate; forming a plurality of organic light emitting devices on the display area of the flexible substrate; detecting a crack of the inorganic layer portion formed on the peripheral area of the flexible substrate; and forming a crack guide hole around the crack.

17 Claims, 5 Drawing Sheets

FLEXIBLE DISPLAY APPARATUS AND METHOD OF MANUFACTURING THE SAME

CROSS-REFERENCE TO RELATED APPLICATION

Korean Patent Application No. 10-2014-0122925, filed on Sep. 16, 2014, in the Korean Intellectual Property Office, and entitled: "Flexible Display Apparatus and Method of Manufacturing the Same," is incorporated by reference herein in its entirety.

BACKGROUND

1. Field

Embodiments relate to a flexible display apparatus and a method of manufacturing the same.

2. Description of the Related Art

From among display apparatuses, an organic light emitting display apparatus has a wide angle of view and a high contrast ratio, and also a fast response speed, and thus is regarded as a next-generation display apparatus.

From among organic light emitting display apparatuses, flexible display apparatuses have been considered. To manufacture a flexible display apparatus, a flexible substrate (formed of a material such as a synthetic resin) may be used, instead of a glass material substrate of other apparatuses.

SUMMARY

Embodiments are directed to a flexible display apparatus and a method of manufacturing the same.

The embodiments may be realized by providing a method of manufacturing a flexible display apparatus, the method including preparing a flexible substrate such that the flexible substrate includes a display area and a peripheral area at an outer portion of the display area; forming an inorganic layer portion on the display area and the peripheral area of the flexible substrate; forming a plurality of organic light emitting devices on the display area of the flexible substrate; detecting a crack of the inorganic layer portion formed on the peripheral area of the flexible substrate; and forming a crack guide hole around the crack.

Forming the crack guide hole may include forming a crack guide hole in the inorganic layer portion by laser drilling.

Forming the crack guide hole may include forming a crack guide hole in a propagation path of the crack.

Forming the crack guide hole may include forming a crack guide hole on the peripheral area of the flexible substrate between an end of the crack and the display area of the flexible substrate.

Forming the crack guide hole may include forming a crack guide hole in a path different from a propagation path of the crack.

Forming the crack guide hole may include sequentially forming a plurality of crack guide holes in a direction towards an edge of the flexible substrate.

Forming the crack guide hole may include forming a first crack guide hole and a second crack guide hole in the peripheral area of the flexible substrate between an end of the crack and the display area of the flexible substrate, and a crack stopping line connecting the first and second crack guide holes by a shortest distance therebetween.

Forming the first and second crack guide holes may include spacing the first and second crack guide holes apart from an end portion of the display area by the same distance.

Forming the crack stopping line may include using a laser to form a groove that connects the first and second crack guide holes in the inorganic layer portion on the peripheral area of the flexible substrate.

Forming the crack stopping line may include forming the crack stopping line parallel to an axis that is adjacent to the end portion of the display area.

Detecting the crack may include detecting a crack generated in an edge portion of the inorganic layer portion on the peripheral area of the flexible substrate.

The embodiments may be realized by providing a flexible display apparatus including a flexible substrate, the flexible substrate including a display area and a peripheral area at an outer portion of the display area; an inorganic layer portion on the display area and the peripheral area of the flexible substrate; an organic light emitting device on the display area of the flexible substrate; and a crack guide hole portion in the inorganic layer portion on the peripheral area of the flexible substrate.

The crack guide hole portion may include a plurality of crack guide holes, and the crack guide holes may be sequentially disposed in a direction towards an edge of the flexible substrate.

The crack guide hole portion may include a first crack guide hole, a second crack guide hole, and a crack stopping line connecting the first and second crack guide holes.

The first crack guide hole and the second crack guide hole may be spaced apart from an end portion of the display area by the same distance.

The crack stopping line may connect the first and second crack guide holes by a shortest distance therebetween.

The crack stopping line may be parallel to an axis that is adjacent to the end portion of the display area.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
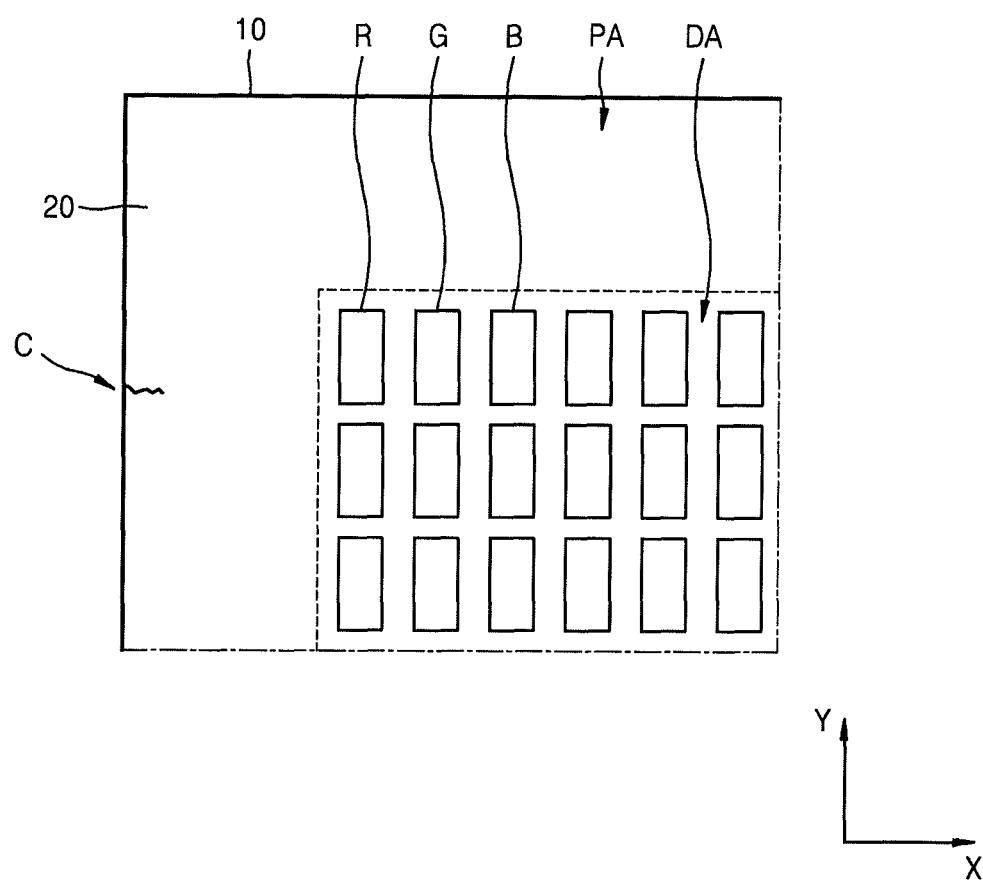
FIGS. 1 and 2 illustrate schematic plan views of a portion of a manufacturing process of a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. Also, singular expressions, unless defined otherwise in contexts, include plural expressions.

In the embodiments below, it will be further understood that the terms "include," "comprise," and/or "have" used herein specify the presence of stated features or components, but do not preclude the presence or addition of one or more other features or components. Also, it will be understood when a portion such as a layer, an area, or an element is referred to as being "on" or "above" another portion, it can be directly on or above the other portion, or intervening portion may also be present.

In the embodiments below, an x-axis, a y-axis, and a z-axis are not limited to three axes on a rectangular coordinates system but may be construed as including these axes. For example, an x-axis, a y-axis, and a z-axis may be at right angles or not may also indicate different directions from one another, which are not at right angles.

When an embodiment is implementable in another manner, a predetermined process order may be different from a described one. For example, two processes that are consecutively described may be substantially simultaneously performed or may be performed in an opposite order to the described order.

Figure 2:
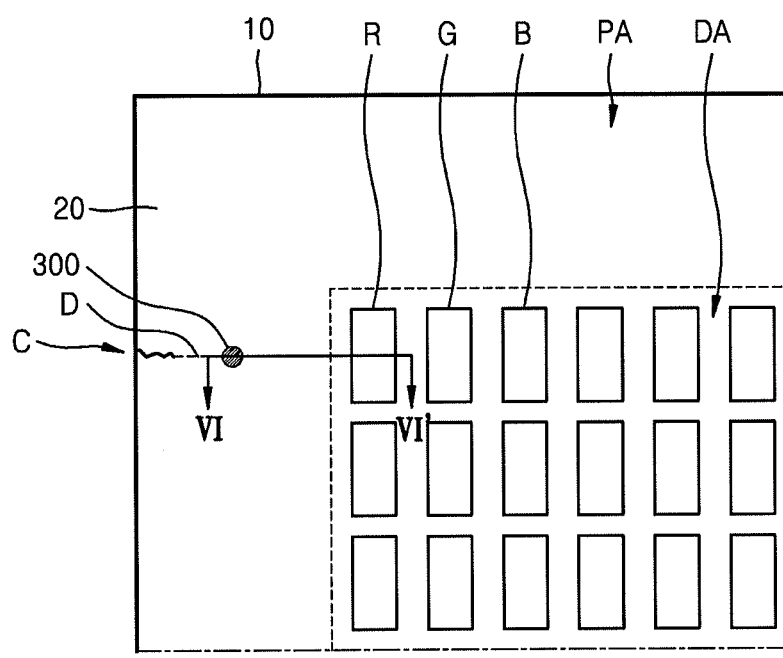

FIGS. 1 and 2 illustrate schematic plan views of a portion of a flexible display apparatus in a manufacturing process according to an embodiment.

Referring to FIGS. 1 and 2, in the method of manufacturing a flexible display apparatus according to an embodiment, first, a flexible substrate 10 having a display area DA and a peripheral area PA (on an outer portion of the display area DA) may be provided. The flexible substrate 10 may have flexibility and may be formed of various materials, e.g., a metal or a plastic material (such as a polyethylene terephthalate (PET), polyethylene naphthalate (PEN), or polyimide). The flexible substrate 10 may include the display area DA (in which a plurality of pixels are disposed) and the peripheral area PA (surrounding the display area DA). The flexible substrate 10 may have flexibility, and the flexible substrate 10 may be formed on a support substrate (not shown) having sufficient or suitable rigidity. After performing several processes on the flexible substrate 10 formed on the support substrate, the flexible substrate 10 may be separated. The support substrate may be formed of various materials having sufficient or suitable rigidity, e.g., a glass material, a metal, or a plastic material.

Next, an inorganic layer portion 20 may be formed on the display area DA and the peripheral area PA of the flexible substrate 10. The inorganic layer portion 20 may cover at least a portion of the peripheral area PA of the flexible substrate 10, and may extend up to an end of the peripheral area PA of the flexible substrate 10, as illustrated in FIG. 1. In an implementation, the inorganic layer portion 20 may be formed as a single layer or a multilayer. For example, at least one of a barrier layer 102 (see FIG. 6), a buffer layer 110 (see FIG. 6), a gate insulation layer 130 (see FIG. 6), or an interlayer insulation layer 150 (see FIG. 6) may be formed as a single layer or a multilayer. The inorganic layer portion 20 may be formed of or include, e.g., a silicon oxide, a silicon nitride, or the like. In an implementation, the barrier layer 102, the buffer layer 110, the gate insulation layer 130, and the interlayer insulation layer 150 may be formed on an entire surface of the flexible substrate 10.

After forming the inorganic layer portion 20 as described above, a plurality of organic light emitting devices 200 (see FIG. 6) may be formed on the display area DA of the flexible substrate 10. Each of the organic light emitting devices 200 may form a red subpixel R, a green subpixel G, or a blue subpixel B, and a set of the subpixels R, G, and B may form a display area DA. Although a plurality of red subpixels R, a plurality of green subpixels G, and a plurality of blue subpixels B are formed along an x-axis in a predetermined direction (+x direction), the embodiments are not limited thereto, and arrangement of the subpixels R, G, and B may vary according to embodiments.

Next, as illustrated in FIG. 1, if a crack C in the inorganic layer portion 20 on the peripheral area PA of the flexible substrate 10 is generated, the crack C may be detected. The crack C may be generated when handling the flexible substrate 10 during a manufacturing process due to flexible characteristics of the flexible substrate 10. The crack C may be particularly generated in an edge portion 20e of the inorganic layer portion 20 on the peripheral area PA of the flexible substrate 10. The crack C generated at the edge portion 20e of the inorganic layer portion 20 may propagate towards the display area DA and may cause damage (e.g., lighting defects) to the subpixels R, G, and B in the display area DA.

Thus, as illustrated in FIG. 2, in the method of manufacturing a flexible display apparatus according to an embodiment, a crack guide hole 300 may be formed near the crack C generated at the edge portion 20e of the inorganic layer portion 20. The crack guide hole 300 may be formed in the inorganic layer portion 20 by laser drilling. For example, as a laser source, a suitable laser for a processing may be used. For example, a $CO_2$ gas laser, a solid-state laser, a Nd:YAG laser or the like may be used, and the laser source may be varied according to processing precision and a processing level of the crack guide hole 300.

Referring to FIG. 2, the crack guide hole 300 may be formed in a crack propagation path D of the crack C. For example, the crack guide hole 300 may be formed in the peripheral area PA between an end of the crack C and the display area DA. For example, the crack C in FIG. 2 may propagate from an edge of the inorganic layer portion 20 on the peripheral area PA towards the display area DA (in the +x direction), and an expected propagation path D of the crack C is denoted by a dotted line. Thus, the crack guide hole 300 may be formed along the expected propagation path D of the crack C, and the crack C may propagate only up to the crack guide hole 300 formed along the expected propagation path D. For example, the crack C may only propagate up to, and may not propagate past, the crack guide hole 300, such that the crack C may no longer propagate towards the display area DA.

By using the crack guide hole 300, defects of the subpixels R, G, and B (e.g., due to the amount in which the crack C generated at the edge portion 20e of the inorganic layer portion 20 propagates toward the display area DA during a manufacturing process of a flexible display apparatus) may be significantly reduced and/or prevented.

Figure 3:
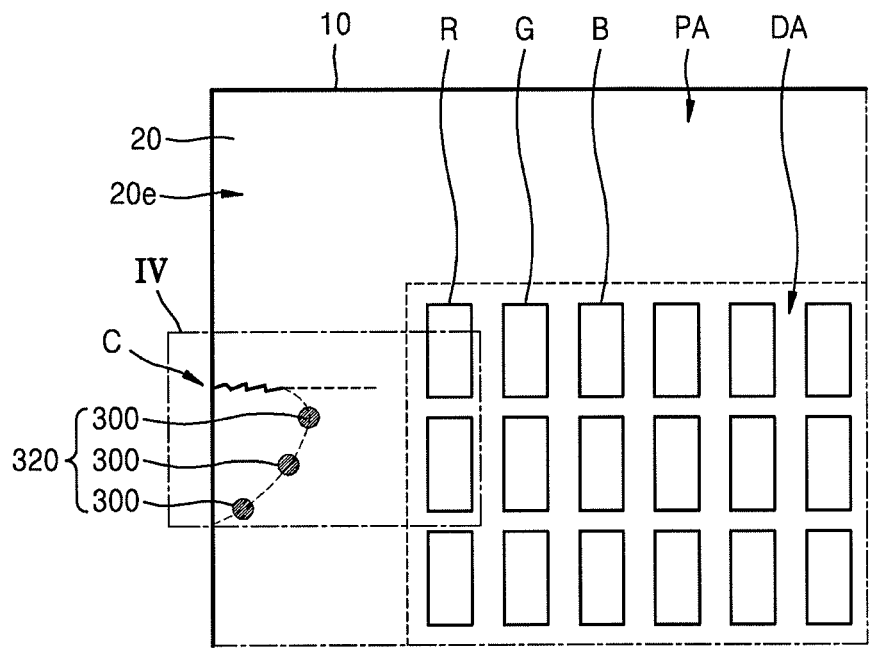
FIG. 3 illustrates a schematic plan view of a portion of a flexible display apparatus in a manufacturing process according to another embodiment.
Figure 4:
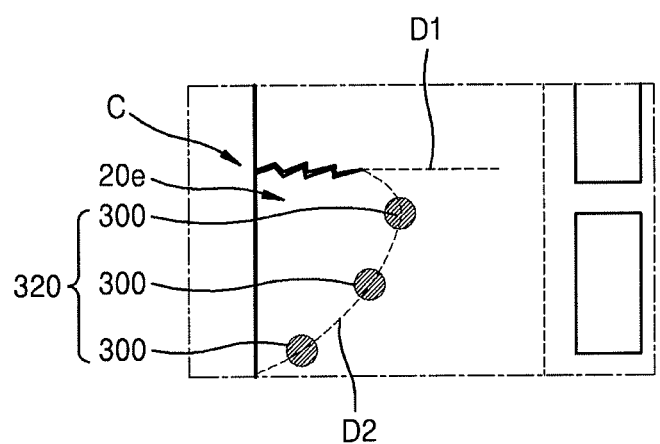
FIG. 4 illustrates a schematic expanded plan view of a portion IV of FIG. 3.

FIG. 3 illustrates a schematic plan view of a portion of a flexible display apparatus in a manufacturing process according to another embodiment. FIG. 4 illustrates a schematic expanded plan view of a portion IV of FIG. 3.

Referring to FIG. 3, in the method of manufacturing a flexible display apparatus according to the present embodiment, first, a flexible substrate 10 having a display area DA and a peripheral area PA in an outer portion of the display area DA may be prepared. Then, an inorganic layer portion 20 may be formed on the display area DA and the peripheral area PA of the flexible substrate 10. The inorganic layer portion 20 may cover at least a portion of the peripheral area PA of the flexible substrate 10 and, as illustrated in FIG. 3, the inorganic layer portion 20 may be formed to extend up to an end of the peripheral area PA of the flexible substrate 10. In an implementation, the inorganic layer portion 20 may be formed as a single layer or a multilayer. For example, at least one of a barrier layer 102, a buffer layer 110, a gate insulation layer 130, and an interlayer insulation layer 150 may be formed as a single layer or a multilayer. In an implementation, the inorganic layer portion 20 may be formed of or may include, e.g., a silicon oxide, a silicon nitride, or the like. Meanwhile, a plurality of organic light emitting device 200 may be formed on the display area DA of the flexible substrate 10 on the inorganic layer portion 20. The above-described manufacturing processes may be the same as those described above with reference to FIGS. 1 and 2, and thus description thereof may not be repeated and the description with reference to FIGS. 1 and 2 will be referred to.

Next, as illustrated in FIG. 3, if a crack C in the inorganic layer portion 20 on the peripheral area PA of the flexible substrate 10 is generated, the crack C may be detected. The crack C may be generated when handling the flexible substrate 10 during a manufacturing process due to flexible characteristics of the flexible substrate 10. The crack C may be particularly generated in an edge of the inorganic layer portion 20 on the peripheral area PA of the flexible substrate 10. The crack C generated at the edge of the inorganic layer portion 20 may propagate towards the display area DA and may cause damage (such as lighting defects) to the subpixels R, G, and B formed in the display area DA.

In an implementation, to help reduce and/or prevent the above-described damage, as illustrated in FIG. 4, the method of manufacturing a flexible display apparatus according to the present embodiment may include forming a crack guide hole 300 around the crack C generated at the edge of the inorganic layer portion 20. The crack guide hole 300 may be formed in the inorganic layer portion 20 by, e.g., laser drilling. As a laser source, a suitable laser for processing may be used. For example, a $CO_2$ gas laser, a solid-state laser, a Nd:YAG laser or the like may be used, and the laser source may be varied according to processing precision and a processing level of the crack guide hole 300.

Next, referring to FIG. 4, in the method of manufacturing a flexible display apparatus according to the present embodiment, the crack guide hole 300 may be formed in a direction different from a propagation direction of the crack C. For example, when forming the crack guide hole 300, a plurality of crack guide holes 300 may be continuously or sequentially formed in a direction towards an edge portion 20e of the flexible substrate 10. For example, in FIG. 4, the crack C may be formed in a +x direction from an edge of the inorganic layer portion 20 on the peripheral area PA of the flexible substrate 10 towards the display area DA. In this case, the crack C could propagate in a first propagation path D1, which is an expected propagation path, up to the display DA, and thus could damage subpixels.

Thus, according to the present embodiment, as illustrated in FIG. 4, a propagation path of the crack C may be modified by forming a plurality of crack guide holes 300 in a direction different from the first propagation path D1, which is the expected propagation path of the crack C. For example, a path of the crack C may be modified to a second propagation path D2, in which the crack guide holes 300 are formed, according to the crack guide holes 300 formed in a path different from the first propagation path D1. When the crack guide holes 300 are formed around the crack C in a path different from the expected propagation path, propagation of the crack C towards the crack guide holes 300 may be induced. By continuously or sequentially forming a plurality of the crack guide holes 300 in a path back towards the edge portion 20e of the flexible substrate 10, a propagation path of the crack C may be modified such that the crack C does not propagate to the display area DA, but rather back to the edge portion 20e of the flexible substrate 10.

Figure 5:
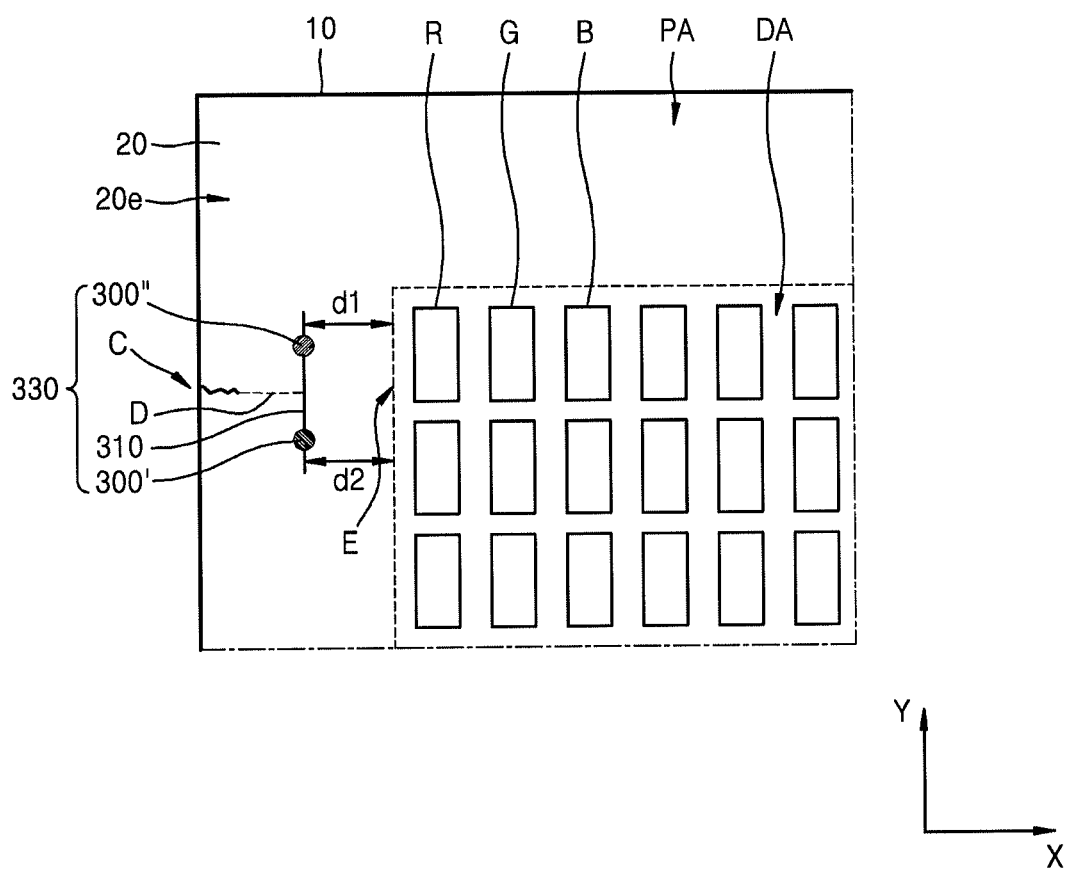
FIG. 5 illustrates a schematic plan view of a portion of a flexible display apparatus in a manufacturing process of according to another embodiment.

FIG. 5 illustrates a schematic plan view of a portion of a flexible display apparatus in a manufacturing process according to another embodiment.

Referring to FIG. 5, in the method of manufacturing a flexible display apparatus according to the present embodiment, first, a flexible substrate 10 having a display area DA and a peripheral area PA in an outer portion of the display area DA may be prepared. Then, an inorganic layer portion 20 may be formed on the display area DA and the peripheral area PA of the flexible substrate 10. The inorganic layer portion 20 may cover at least a portion of the peripheral area PA of the flexible substrate 10. In an implementation, as illustrated in FIG. 5, the inorganic layer portion 20 may be formed to extend up to an end of the peripheral area PA of the flexible substrate 10. In an implementation, the inorganic layer portion 20 may be formed as a single layer or a multilayer. For example, at least one of a barrier layer 102, a buffer layer 110, a gate insulation layer 130, and an interlayer insulation layer 150 may be formed as a single layer or a multilayer. The inorganic layer portion 20 may be formed of or may include, e.g., a silicon oxide, a silicon nitride, or the like. Meanwhile, a plurality of organic light emitting devices 200 may be formed on the display area DA of the flexible substrate 10 on the inorganic layer portion 20. The above-described manufacturing processes are the same as those described above with reference to FIGS. 1 and 2, and thus a description thereof may not be repeated and the description with reference to FIGS. 1 and 2 will be referred to.

Next, as illustrated in FIG. 5, if a crack C in the inorganic layer portion 20 on the peripheral area PA of the flexible substrate 10 is generated, the crack C may be detected. The crack C may be generated when handling the flexible substrate 10 during a manufacturing process due to flexible characteristics of the flexible substrate 10. The crack C may be particularly generated in an edge of the inorganic layer portion 20 on the peripheral area PA of the flexible substrate 10. The crack C generated at the edge of the inorganic layer portion 20 may propagate towards the display area DA and may cause damage (e.g., lighting defects) to subpixels formed in the display area DA.

In an implementation, to help reduce and/or prevent the above-described damage, as illustrated in FIG. 5, the method of manufacturing a flexible display apparatus according to the present embodiment may include forming crack guide holes 300' and 300" around the crack C generated at the edge of the inorganic layer portion 20. The crack guide holes 300' and 300" may be formed in the inorganic layer portion 20 by, e.g., laser drilling. In an implementation, as a laser source, a suitable laser for a processing may be used. For example, a $CO_2$ gas laser, a solid-state laser, a Nd:YAG laser, or the like may be used, and the laser source may be varied according to processing precision and a processing level of the crack guide holes 300' and 300".

For example, in the method of manufacturing a flexible display apparatus according to the present embodiment (illustrated in FIG. 5), first, a first crack guide hole 300' and a second crack guide hole 300" may be formed in the peripheral area PA between an end of the crack C and the display area DA. The first crack guide hole 300' and the second crack guide hole 300" may be spaced apart from an end E of the display area DA of the flexible substrate 10 by the same distance. For example, a distance d1 between the end E of the display area DA and the first crack guide hole 300' and a distance d2 between the end E of the display area DA and the second crack guide hole 300" may be the same.

After forming the first crack guide hole 300' and the second crack guide hole 300", a crack stopping line 310 (that connects the first crack guide hole 300' and the second crack guide hole 300") may be formed. The length of the crack stopping line 310 may be equal to a shortest distance between the first crack guide hole 300' and the second crack guide hole 300". Formation of the crack stopping line 310 may include forming a groove that connects the first crack guide hole 300' and the second crack guide hole 300" by using a laser on the inorganic layer portion 20 on the peripheral area PA of the flexible substrate 10. For example, the crack stopping line 310 may not pass all the way through the inorganic layer portion 20. The crack stopping line 310 may be formed as an approximately straight line that respectively has the first crack guide hole 300' and the second crack guide hole 300" as a starting point and an end point. The first crack guide hole 300' and the second crack guide hole 300" may be spaced apart from the end E of the display area DA by the distances d1 and d2 (which are identical to each other), as described above, and the crack stopping line 310 may be formed to be parallel to an axis that is adjacent to the end E of the display area DA.

For example, referring to FIG. 5, the crack C may propagate from the edge portion 20e of the inorganic layer portion 20 (on the peripheral area PA of the flexible substrate 10) towards the display area DA in a +x direction. As described above, the crack stopping line 310 (that connects the first crack guide hole 300' and the second crack guide hole 300") may be formed such that the crack stopping line 310 and the crack propagation path D of the crack C intersect. The crack C may only propagate up to, and may not propagate past, the crack stopping line 310, such that the crack C may no longer propagate towards the display area DA.

In an implementation, the crack C may first be generated and observed or detected, and then the crack guide hole 300 may be formed where the crack C is generated in response to generation of the crack C, as described above. In an implementation, a portion of the inorganic layer portion 20 where a crack C is likely to be formed may be predicted, and the crack guide hole 300 may be formed in that portion, e.g., preemptively.

As described above with reference to FIGS. 1 through 5, to help reduce and/or prevent reliability concerns (such as product defects due to gradual progress of the crack C generated at the edge portion 20e of the inorganic layer portion 20 on the peripheral area PA of the flexible substrate 10, due to an external impact or the like), and to help improve reliability of the flexible display apparatus, in the method of manufacturing a flexible display apparatus of the embodiments, progress of the crack C may be stopped by forming the crack guide hole 300 and the crack stopping line 310 around the crack C found during a manufacturing process, or a propagation path of the crack C may be modified to help prevent initial defects of the flexible display apparatus.

While description above is focused on the method of manufacturing a flexible display apparatus, the embodiments are not limited thereto. For example, the embodiments may provide a flexible display apparatus manufactured according to the above-described method.

Figure 6:
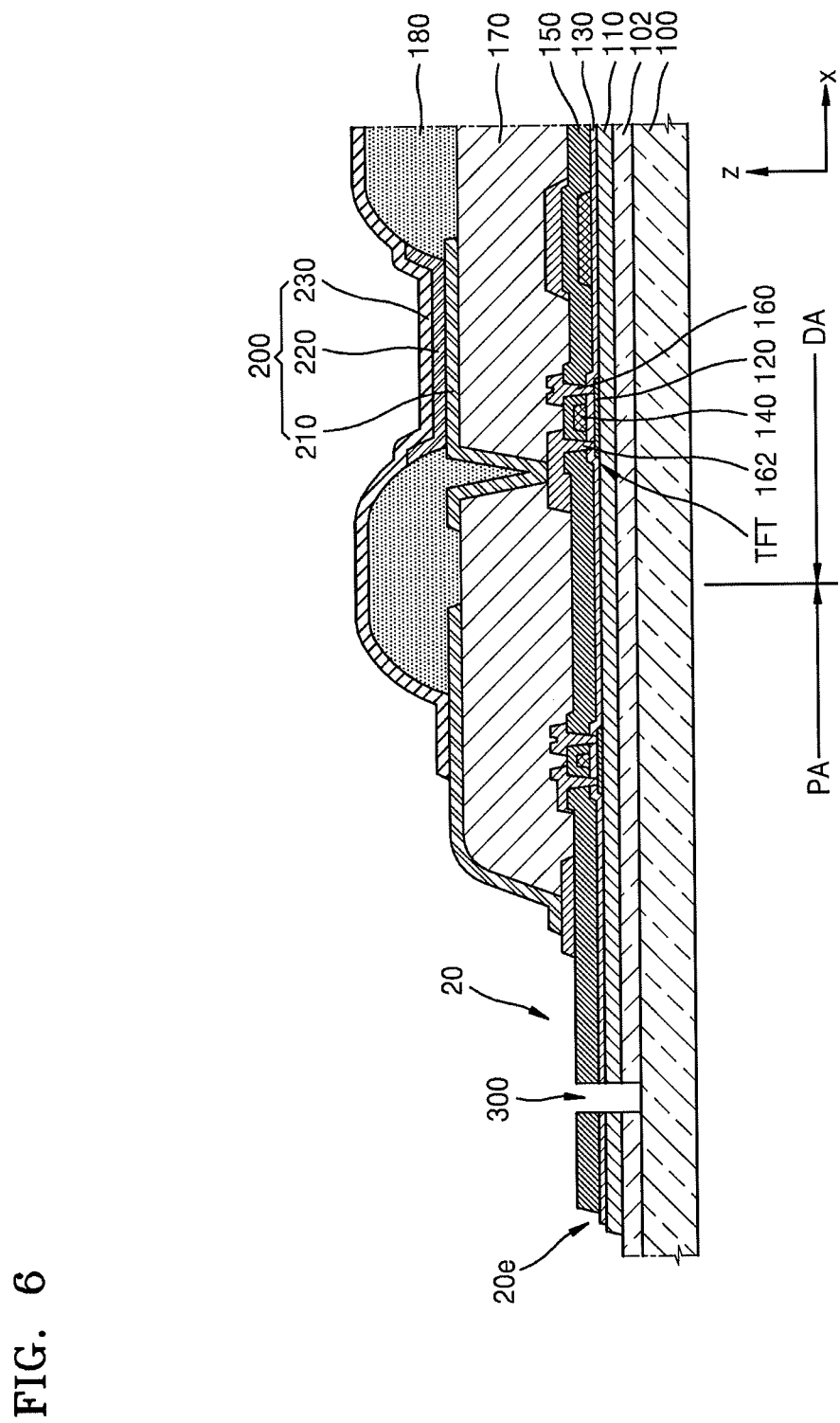
FIG. 6 illustrates a schematic cross-sectional view of the flexible display apparatus of FIG. 2 cut along a line VI-VI'.

FIG. 6 illustrates a schematic cross-sectional view of the flexible display apparatus of FIG. 2 cut along a line VI-VI'. For example, FIG. 6 illustrates a cross-sectional view of a flexible substrate 10 on which the display area DA and the peripheral area PA including the crack guide hole 300 described above are formed.

Referring to FIG. 2 and FIG. 6, the flexible substrate 10 may include the display area DA and the peripheral area PA in an outer portion of the display area DA. The display area DA may be where the organic light emitting devices 200 are disposed, and the peripheral area PA in the outer portion of the display area DA may be dead space where display is not provided or performed. For example, a driving unit that applies an electrical signal to the display area DA may be disposed in the peripheral area PA. The flexible substrate 10 may be formed of various materials, e.g., a glass material, a metal, a plastic material (such as PET, PEN, or polyimide), or the like.

A barrier layer 102 that helps prevent penetration of impurities into the flexible substrate 10 may be disposed on the flexible substrate 10. The barrier layer 102 may be formed of, e.g., a silicon oxide or a silicon nitride.

A plurality of thin film transistors (TFTs) may be disposed in the display area DA of the flexible substrate 10 and, in addition to the TFTs, a plurality of organic light emitting devices 200 (that are electrically connected to the TFTs) may be disposed in the display area DA of the flexible substrate 10. Electrical connection of the organic light emitting devices 200 to the TFTs may be understood as electrical connection of a plurality of pixel electrodes 210 to the plurality of TFTs.

TFTs may also be disposed in the peripheral area PA of the flexible substrate 10. The TFTs may be, e.g., a portion of a driving unit that controls an electrical signal applied to the display area DA.

The TFTs may include a semiconductor layer 120 including amorphous silicon, polycrystalline silicon, or an organic semiconductor, a gate electrode 140, a source electrode 160, and a drain electrode 162. A buffer layer 110 formed of a silicon oxide or a silicon nitride may be disposed on the flexible substrate 10 to planarize a surface of the flexible substrate 10 and/or to help prevent penetration of impurities into the semiconductor layer 120, and the semiconductor layer 120 may be disposed on the buffer layer 110.

The gate electrode 140 may be disposed on the semiconductor layer 120, and the source electrode 160 and the drain electrode 162 may be electrically conducted with each other when a signal is applied to the gate electrode 140. The gate electrode 140 may be formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) as a single layer or a multilayer in consideration of adhesion with adjacent layers, surface planarization of stacked layers, and processability. To provide insulation properties between the semiconductor layer 120 and the gate electrode 140, the gate insulation layer 130 formed of, e.g., a silicon oxide and/or a silicon nitride, may be interposed between the semiconductor layer 120 and the gate electrode 140.

The interlayer insulation layer 150 may be disposed on the gate electrode 140. The interlayer insulation layer 150 may be formed of a material, e.g., a silicon oxide or a silicon nitride, and as a single layer or a multilayer.

The source electrode 160 and the drain electrode 162 may be disposed on the interlayer insulation layer 150. The source electrode 160 and the drain electrode 162 may be respectively electrically connected to the semiconductor layer 120 via a contact hole in the interlayer insulation layer 150 and the gate insulation layer 130. The source electrode 160 and the drain electrode 162 may each be formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), as a single layer or a multilayer in consideration of conductivity.

A protection layer (not shown) covering the TFTs may be disposed on the TFTs having the above-described structure. The protection layer may be formed of an inorganic material, a silicon oxide, a silicon nitride, or a silicon oxynitride.

The barrier layer 102, the buffer layer 110, the gate insulation layer 103, and the interlayer insulation layer 150 described above may be disposed over the entire surface of the display area DA and the peripheral area PA of the flexible substrate 10.

A first insulation layer 170 may be disposed on the protection layer. In this case, the first insulation layer 170 may be a planarization layer or a protection layer. For example, if the organic light emitting devices 200 are disposed on the TFTs as illustrated in FIG. 6, the first insulation layer 170 may be disposed as a planarization layer that planarizes an upper surface of the TFTs overall. The first insulation layer 170 may be formed of, e.g., an acrylic organic material or benzocyclobutene (BCB). Although the first insulation layer 170 is illustrated as a single layer in FIG. 6, various modifications may be made to the insulation layer 170. For example, the insulation layer 170 may be a multilayer.

In the display area DA of the flexible substrate 10, a plurality of pixel electrodes 210, an opposite electrode 230 facing the pixel electrodes 210, and the organic light emitting devices 200 including an intermediate layer 220 that is interposed between the pixel electrodes 210 and the opposite electrode 230 and includes an emission layer may be disposed on the first insulation layer 170.

An opening portion that exposes at least one of the source electrode 160 and the drain electrode 162 of the TFTs may be formed in the first insulation layer 170, and the pixel electrodes 210 that are electrically connected to the TFTs by contacting one of the source electrode 160 and the drain electrode 162 via the opening portion may be disposed on the first insulation layer 170. The pixel electrodes 210 may be formed of transparent (or semi-transparent) electrodes or reflective electrodes. When the pixel electrodes 210 are formed of transparent (or semi-transparent) electrodes, they may be formed of, e.g., ITO, IZO, ZnO, In2O3, IGO, or AZO. When the pixel electrodes 210 are formed of reflective electrodes, they may include a reflective layer formed of aluminum (Al), platinum (Pt), palladium (Pd), silver (Ag), magnesium (Mg), gold (Au), nickel (Ni), neodymium (Nd), iridium (Ir), chromium (Cr), and compounds thereof, and a layer formed of ITO, IZO, ZnO, In2O3, IGO, or AZO. However, the embodiments are not limited thereto, and the pixel electrodes 210 may be formed of various suitable materials and have various structures such as a single layer or a multilayer.

A second insulation layer 180 may be disposed on the first insulation layer 170. The second insulation layer 180 may be a pixel defining layer that defines pixels by including openings respectively corresponding to the subpixels, e.g., the second insulation layer 180 may be a pixel defining layer that covers edges of the pixel electrodes 210 and exposes at least respective center portions thereof. Also, as illustrated in FIG. 6, the second insulation layer 180 may increase a distance between end portions of the pixel electrodes 210 and the opposite electrode 230 disposed on the pixel electrodes 210, thereby preventing generation of an arc in the end portions of the pixel electrodes 210. The second insulation layer 180 may be formed of an organic material such as polyimide.

The intermediate layer 220 of the organic light emitting devices 200 may include an emission layer (EML). A hole injection layer (HIL), a hole transport layer (HTL) or the like may be disposed under the EML, and an electron transport layer (ETL), an electron injection layer (EIL), or the like may be disposed on the EML.

The intermediate layer 220 may include a low-molecular weight material or a polymer material. When a low-molecular weight material is included, the EML, the HIL, the HTL, the ETL, and the EIL or the like may be stacked in a single structure or a complex structure. Examples of an organic material that may be used to form the intermediate layer 220 may include copper phthalocyanine (CuPc), N,N'-Di(naphthalene-1-yl)-N,N'-diphenyl-benzidine (NPB), and tris-8-hydroxyquinoline aluminum (Alq3). The layers may be formed by using, e.g., a vacuum deposition method.

When the intermediate layer 220 includes a polymer material, the intermediate layer 220 may generally include an HTL and an EML. The HTL may be formed of poly (ethylenedioxythiophene) (PEDOT), and the EML may be formed of a polymer material such as a polyphenylenevinylene (PPV)-based material or a polyfluorene-based material, and by using a method such as a screen printing method, an inkjet printing method, or a laser induced thermal imaging (LITI) method. However, the intermediate layer 220 is not limited thereto and may have other various structures.

The opposite electrode 230 may be disposed over the entire surface of the display area DA, and as illustrated in FIG. 1, the opposite electrode 230 may be disposed to cover at least a portion of the display area DA and the peripheral area PA. For example, the opposite electrode 230 may be formed as a single body with the organic light emitting devices 200 so as to correspond to the plurality of pixel electrodes 210.

The opposite electrode 230 may be formed as a transparent (or semi-transparent) electrode or a reflective electrode. When the opposite electrode 230 is formed of a transparent (or semi-transparent) electrode, it may include a layer formed of a metal having a small work function, that is, Li, Ca, LiF/Ca, LiF/Al, Al, Ag, Mg, and a compound thereof and a transparent (or semi-transparent) conductive layer such as ITO, IZO, ZnO, or $In_2O_3$. When the opposite electrode 230 is formed as a reflective electrode, it may include a layer formed of Li, Ca, LiF/Ca, LiF/Al, Al, Ag, Mg, and a compound thereof. However, a structure and materials of the opposite electrode 230 are not limited thereto, and various modifications may be made to the opposite electrode 230.

In addition, while not illustrated in the drawings, after forming the organic light emitting display devices 200, encapsulation, a polarization plate, or the like may be further formed on the opposite electrode 230.

As described above, the inorganic layer portion 20 including at least one of the barrier layer 102, the buffer layer 110, the gate insulation layer 130, and the interlayer insulation layer 150 may be formed on the peripheral area PA of the flexible substrate 10. As illustrated in FIG. 6, the crack guide hole 300 may be disposed in the inorganic layer portion 20. The crack guide hole 300 may be formed by laser drilling or the like as described above.

A crack C may be generated in the inorganic layer portion 20 disposed in the peripheral area PA of the flexible substrate 10 in a process of handling the flexible substrate 10 during a manufacturing process of a flexible display apparatus or due to panel shrinkage of the flexible substrate 10. The crack C may be particularly generated at the edge portion 20e of the inorganic layer portion 20, and the crack C may propagate towards the display area DA and damage the organic light emitting display devices 200. Thus, in the flexible display apparatus according to an embodiment, the crack guide hole 300 may be formed around the crack C so as to prevent progression of the crack C of the edge portion 20e of the inorganic layer portion 20 to the display area DA.

For example, referring to FIG. 2 when the crack guide hole 300 is formed in a propagation path of the crack C (+x direction), the crack C may only propagate up to, and may not propagate past, the crack guide hole 300, such that the crack C may no longer propagate toward the display area DA.

Referring to FIGS. 3 and 4 again, a crack guide hole portion 320 may be disposed in the inorganic layer portion 20 in the peripheral area PA. The crack guide hole portion 320 may include a plurality of crack guide holes 300. As illustrated in FIGS. 3 and 4, the plurality of crack guide holes 300 may be continuously or sequentially disposed in an edge direction of the flexible substrate 10 (−x direction). For example, referring to FIG. 3 and FIG. 4, a plurality of crack guide holes 300 may be continuously or sequentially formed in a path different from the propagation path of the crack C (+x direction) back towards the edge portion 20e of the inorganic portion 20, and the propagation path of the crack C (+x direction) may be changed, thereby preventing the crack C from propagating towards the display area DA.

Meanwhile, referring to FIGS. 5 and 6, a crack guide hole portion 330 may be disposed in the inorganic layer portion 20 in the peripheral area PA of the flexible substrate 10. The crack guide hole portion 330 may include a plurality of crack guide holes 300' and 300". The crack guide hole portion 330 may include a first crack guide hole 300' and a second crack guide hole 300", and may include a crack stopping line 310 connecting the first crack guide hole 300' and the second crack guide hole 300". The first crack guide hole 300' and the second crack guide hole 300" may be disposed at the same distance from the end portion E of the display area DA of the flexible substrate 10. For example, as illustrated in FIG. 5, the first crack guide hole 300' may be formed at a first distance d1 from the end portion E of the display area DA, and the second crack guide hole 300' may be formed at a second distance d2 from the end portion E of the display area DA, and the first distance d1 and the second distance d2 may be the same.

The crack stopping line 310 may connect the first crack guide hole 300' and the second crack guide hole 300" by a shortest distance. For example, the crack stopping line 310 may be a straight line that connects the first crack guide hole 300' and the second crack guide hole 300". The crack stopping line 310 may be formed to be parallel to an axis that is adjacent to the end portion E of the display area DA of the flexible substrate 10. The axis that is adjacent to the end portion E of the display area DA in FIG. 5 is illustrated to be approximately parallel to a y-axis, but the embodiment is not limited thereto.

For example, the first crack guide hole 300' and the second crack guide hole 300" may be formed on two sides with respect to the propagation path of the crack C (+x direction), and the crack stopping line 310 (which is a line connecting the first and second crack guide holes 300' and 300" by a shortest distance) may be formed. Thus, when the crack C (that is propagating towards the display area DA) meets the crack stopping line 310, the crack C may not propagate anymore, but rather stops at the crack stopping line 310. Accordingly, progression of the crack C towards the display area DA (+x direction) may be prevented.

By way of summation and review, the flexible substrate is flexible, and it may be difficult to handle the flexible substrate in a manufacturing process. Thus, a flexible substrate may be formed on a support substrate having enough rigidity to support the flexible substrate, several processes may be performed on the flexible substrate while on the support substrate, and then the flexible substrate may be separated from the support substrate.

However, according to some flexible display apparatuses and methods of manufacturing the same, a crack may be generated in an inorganic layer portion of a substrate edge due to flexibility of the flexible substrate, and if the crack propagates to a display area, pixel defects may be caused thereby, and this may degrade reliability of the flexible display apparatuses.

As described above, according to the flexible display apparatus and the method of manufacturing the flexible display apparatus of the one or more of the above embodiments, a defect rate may be reduced. Of course, the scope of the exemplary embodiments is not restricted by this effect.

The embodiments may provide a flexible display apparatus in which a defect rate of which is reduced in a method of manufacturing the flexible display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a flexible display apparatus, the method comprising:
    preparing a flexible substrate such that the flexible substrate includes a display area and a peripheral area at an outer portion of the display area;
    forming an inorganic layer portion on the display area and the peripheral area of the flexible substrate;
    forming a plurality of organic light emitting devices on the display area of the flexible substrate;
    detecting a crack of the inorganic layer portion formed on the peripheral area of the flexible substrate; and
    forming a crack guide hole around the crack.

2. The method as claimed in claim 1, wherein forming the crack guide hole includes forming a crack guide hole in the inorganic layer portion by laser drilling.

3. The method as claimed in claim 2, wherein forming the crack guide hole includes forming a crack guide hole in a propagation path of the crack.

4. The method as claimed in claim 3, wherein forming the crack guide hole includes forming a crack guide hole on the peripheral area of the flexible substrate between an end of the crack and the display area of the flexible substrate.

5. The method as claimed in claim 2, wherein forming the crack guide hole includes forming a crack guide hole in a path different from a propagation path of the crack.

6. The method as claimed in claim 5, wherein forming the crack guide hole includes sequentially forming a plurality of crack guide holes in a direction towards an edge of the flexible substrate.

7. The method as claimed in claim 2, wherein forming the crack guide hole includes forming:
   a first crack guide hole and a second crack guide hole in the peripheral area of the flexible substrate between an end of the crack and the display area of the flexible substrate, and
   a crack stopping line connecting the first and second crack guide holes by a shortest distance therebetween.

8. The method as claimed in claim 7, wherein forming the first and second crack guide holes includes spacing the first and second crack guide holes apart from an end portion of the display area by the same distance.

9. The method as claimed in claim 8, wherein forming the crack stopping line includes using a laser to form a groove that connects the first and second crack guide holes in the inorganic layer portion on the peripheral area of the flexible substrate.

10. The method as claimed in claim 9, wherein forming the crack stopping line includes forming the crack stopping line parallel to an axis that is adjacent to the end portion of the display area.

11. The method as claimed in claim 1, wherein detecting the crack includes detecting a crack generated in an edge portion of the inorganic layer portion on the peripheral area of the flexible substrate.

12. A flexible display apparatus, comprising:
   a flexible substrate, the flexible substrate including a display area and a peripheral area at an outer portion of the display area;
   an inorganic layer portion on the display area and the peripheral area of the flexible substrate;
   an organic light emitting device on the display area of the flexible substrate; and
   a crack guide hole portion in the inorganic layer portion on the peripheral area of the flexible substrate.

13. The flexible display apparatus as claimed in claim 12, wherein:
   the crack guide hole portion includes a plurality of crack guide holes, and
   the crack guide holes are sequentially disposed in a direction towards an edge of the flexible substrate.

14. The flexible display apparatus as claimed in claim 12, wherein the crack guide hole portion includes a first crack guide hole, a second crack guide hole, and a crack stopping line connecting the first and second crack guide holes.

15. The flexible display apparatus as claimed in claim 14, wherein the first crack guide hole and the second crack guide hole are spaced apart from an end portion of the display area by the same distance.

16. The flexible display apparatus as claimed in claim 15, wherein the crack stopping line connects the first and second crack guide holes by a shortest distance therebetween.

17. The flexible display apparatus as claimed in claim 16, wherein the crack stopping line is parallel to an axis that is adjacent to the end portion of the display area.

* * * * *